United States Patent [19]

Gerard

[11] 4,163,958

[45] Aug. 7, 1979

[54] HYBRID TRANSVERSAL FILTER

[75] Inventor: Henry M. Gerard, Capistrano Beach, Calif.

[73] Assignee: Hughes Aircraft Company, Culver City, Calif.

[21] Appl. No.: 847,966

[22] Filed: Nov. 2, 1977

[51] Int. Cl.$^2$ .................... H03H 7/28; H03H 9/26; H03H 9/30; G11C 19/28

[52] U.S. Cl. .................... 333/165; 333/166; 333/193

[58] Field of Search .................... 333/70 T, 72, 30 R, 333/29, 28 R; 307/221 D, 221 R, 221 C; 328/167; 310/313; 357/24, 26, 41; 364/820, 821, 824, 825, 862

[56] References Cited

U.S. PATENT DOCUMENTS 3,621,221  11/1971  Cann .................... 333/28 R X
3,818,382  6/1974  Holland et al. .................... 307/221 R X

OTHER PUBLICATIONS

Mavor—"Signal Processing Applications of Charge-Coupled Devices" in The Radio and Electronic Engineer, vol, 46, No. 819 Aug./Sep. 1976; pp.412–420.

Primary Examiner—Alfred E. Smith
Assistant Examiner—Marvin Nussbaum
Attorney, Agent, or Firm—John Holtrichter, Jr.; W. H. MacAllister

[57] ABSTRACT

A tapped delay line transversal filter utilizing both surface acoustic wave and charge coupled device technologies, the surface acoustic wave tapped delay line portion providing a coarse selection and the charge coupled device tapped delay line portion providing vernier weighting.

10 Claims, 6 Drawing Figures

HYBRID TRANSVERSAL FILTER

BACKGROUND OF THE INVENTION

The background of the invention will be set forth in two parts:

1. Field of the Invention

This invention relates to radio frequency filter devices and more particularly to surface acoustic wave devices and charge coupled devices in tapped delay line configurations.

2. Description of the Prior Art

The tapped delay line (TDL) is well known as an important device for analog signal processing. With the addition of adjustable tap weights, it becomes a programmable transversal filter. Using a straight-forward synthesis procedure, the tap-weights can be selected so as to implement a wide range of transversal filter transfer functions. In general, however, the design range of the transversal filter is limited by the performance of the TDL and of the tap weight circuits.

It is fundamental to the design of all TDL transversal filters that the maximum bandwidth of the synthesized filter is the inverse of the intertap delay. Furthermore, the TDL frequency resolution capability is proportional to the overall delay time as described, for example, by H. E. Kallman in "Transversal Filters", Proceedings of the I. R. E. 28 (July 1940) pp. 302-310. Therefore, it can be seen that obtaining broad bandwidth and high resolution requires a long TDL with many closely spaced taps. Also, for proper transversal filter operation, it is important that the taps have low cross-talk. In the past, surface acoustic wave (SAW) TDL's with a large number of taps have been implemented, but the results were mostly not satisfactory because of propagation loss, tap reflections, tap to tap feed-thru and the interface problem of connecting the individual taps to the tap-weight circuits. In many ways the system requirements drive the TDL parameters to the limits of available technology.

Moving in another direction, the prospect of implementing a TDL using CCD (charge coupled devices) shift register technology has been considered. The function of the CCD TDL is essentially the same as the SAW device although the mechanism of delay is slightly different. First, the input to the CCD is an analog replica of the input signal, sampled at discrete times that are determined by a clock signal. The input sample (charge packet) is then transferred along the delay gates by sequential changes in the gate polarity. Under the influence of a primary clock, the surface potential is lowered ahead of the packet, and then the potential of the packet is raised causing charge to flow along the delay structure. Because the principal driving force causing the transfer between gates is a relatively slow diffusion process, the efficiency of charge transfer is generally strongly dependent on the clock speed. When insufficient transfer time is available, as at high clock rates, incomplete transfer results. This effect is referred to as charge transfer loss. Thesefore, it has generally been concluded that while TDL implementations utilizing CCD technology will provide good results in the frequency range of several MHz, the prospects of substantially extending bandwidth and delay are considered dim. In view of the limitations of these prior art techniques, it should be evident that a new technique involving a novel combination of SAW and CCD technologies which provides greater than 10 MHz bandwidth, several hundred independent taps, large dynamic range, programmability, small size and low power, would constitute a significant advancement of the art.

SUMMARY OF THE INVENTION

In view of the foregoing factors and conditions characteristic of the prior art, it is a primary object of the present invention to provide an improved hybrid transversal filter.

Another object of the present invention is to provide a hybrid transversal filter incorporating both surface acoustic wave and charge coupled device technologies.

Still another object of the present invention is to provide a small size and low power hybrid transversal filter having several hundred independent taps, a large dynamic range, programmability, and a greater than 10 MHz bandwidth.

Yet another object of the present invention is to provide a hybrid transversal filter that does not exhibit inter-tap cross-talk problems due to acoustic reflections and capacitive coupling between closely spaced tap outputs.

Still a further object of the present invention is to provide a hybrid transversal filter having internally implemented programmable tap weights, thereby eliminating the size, expense and power consumption of a separate high speed tap-weight network.

In accordance with the present invention, a hybrid transversal filter includes a surface acoustic wave tapped delay line having an input signal terminal and producing a plurality of SAW output signals in response to an input signal, each of the SAW output signals having a different and relatively long time delay. The invention also includes charge coupled device means with an array of charge coupled device tapped delay lines coupled to the surface acoustic wave tapped delay line and responsive to the SAW output signals, each of the charge coupled device tapped delay lines generating a plurality of relatively short time delay component signals, for producing a relatively broad bandwidth analog-processed transversal filter output signal.

The SAW output signal may be translated to or near the baseband before being introduced to the array of charge coupled device tapped delay lines, or the SAW output signals from the various surface acoustic wave tapped delay lines may be split into component pairs of signals with a 90° phase differential before being coupled to associated charge coupled device tapped delay lines producing a composite output signal which is summed with similar types of signals from the other such devices in the array.

The charge coupled device tapped delay lines may include fixed weighted circuitry, or the weights given each component in the array may be individually programmed, the weighting taking place either before the CCD input signal is introduced to the charge coupled device tapped delay line section, or at the output therefrom.

The features of the present invention which are believed to be novel are set forth with particularity in the appended claims. The present invention, both as to its organization and manner of operation, together with further objects and advantages thereof, may best be understood by making reference to the following description, taken in conjunction with the accompanying drawing in which like reference characters refer to like elements in the several views.

DESCRIPTION OF THE PREFERRED EMBODIMENT

A substantial performance extension of tapped delay line technology has been obtained in accordance with the present invention, through a combination of CCD and SAW techniques. The optimum use of these technologies has led to increased bandwidth and resolution and can even lead to lower power consumption.

Figure 1:
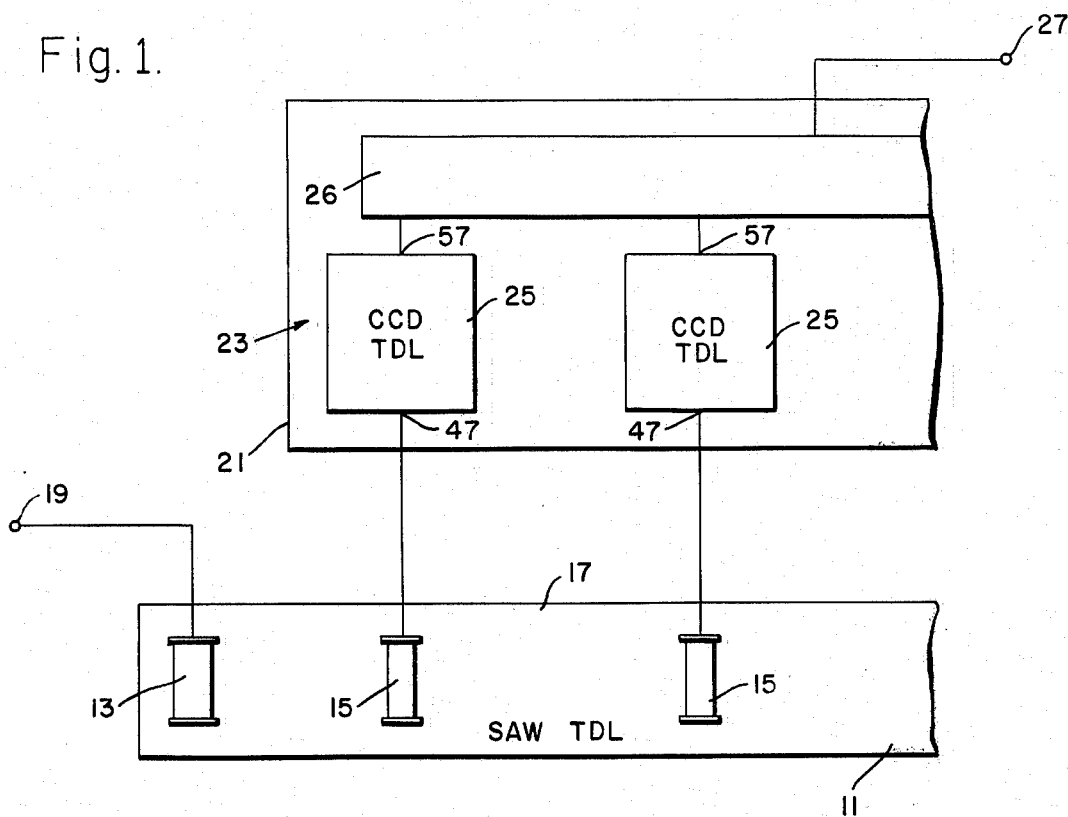
FIG. 1 is a schematic block diagram of a portion of a hybrid transversal filter according to the invention.

Referring now to FIG. 1, there is shown a SAW TDL structure 11 including an input transducer 13 and a plurality of spaced tapping output transducers 15, all disposed on a relatively flat surface 17 of a material capable of supporting propagating surface acoustic wave energy. In response to an input signal introduced to an input signal terminal 19 coupled to the input transducer, there is produced a plurality of SAW output signals, one associated with each of the tapping output transducers 15, and each such signal having a different and relatively long time delay.

Coupled to the tapping output transducers 15 of the SAW TDL structure 11 is a charge coupled device circuit 21 including and array 23 of charge coupled device tapped delay lines 25. In response to the SAW output signals, each of the charge coupled device tapped delay lines 25 generate a plurality of relatively short time delay component signals, which when combined at combining circuitry 26, produce a relatively broad bandwidth analog-processed transversal filter output signal at a filter output terminal 27.

Figure 2:
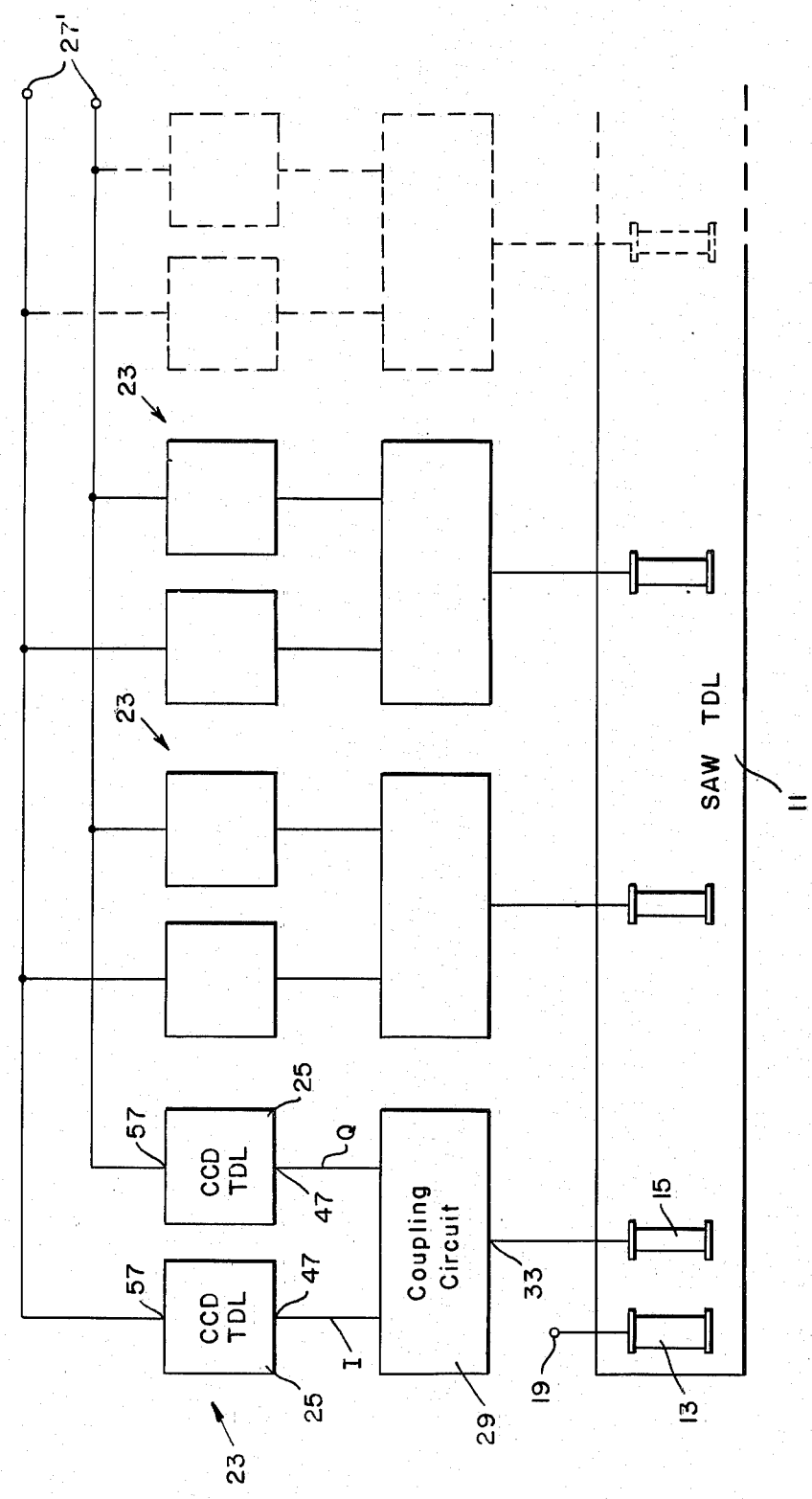
FIG. 2 is a schematic block diagram of a hybrid transversal filter in accordance with another embodiment of the present invention.

Referring now to the embodiment of the invention illustrated in FIG. 2, there is shown a uniform SAW TDL structure 11 employed to drive an array 23 of identical programmable CCD TDL chips 25. The SAW TDL contains M-taps, uniformly spaced at intervals of $Nt_c$, for a total delay $t_{max} = NMt_c$, where $t_c$ is the delay per CCD stage, and N is the number of delay stages. The SAW tap outputs are processed in coupling circuits 29 for translation to (or near) baseband, each of which circuits provides component signal pairs (representing I and Q channels) to associated pairs of CCD TDL's 25. In turn, each of the CCD TDL's processing a respective channel produce a composite signal which is combined with the composite signals from the other CCD TDL's processing the same channel, and the combined composite signals for each channel are brought to filter output terminals 27. A composite signal is herein drafted as the summation of individually weighted and time delayed replicas of the input signal to the CCD TDL's.

Figure 3:
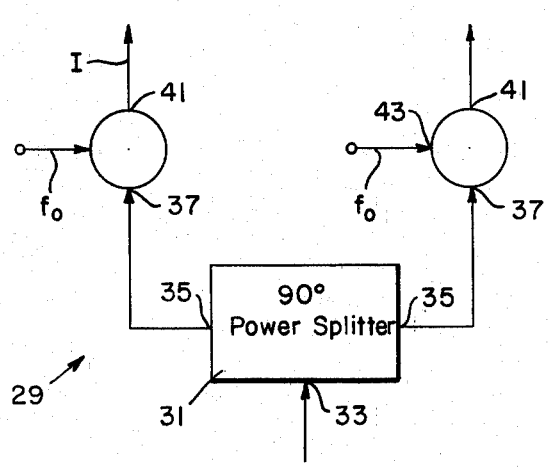
FIG. 3 is a block diagram of a coupling circuit useable in the embodiment of the invention illustrated in FIG. 2.

As shown in FIG. 3, the coupling circuitry 29 may include a conventional 90° power splitter 31 having an input terminal 23 and a pair of output terminals 35, each of the latter being coupled to one input terminal 37 of a conventional mixer 39. In order to provide base band or near base band I and Q component signals for the CCD TDL's at an output terminal 41, a CW signal of appropriate frequency, $f_o$, (which is the center frequency of the SAW transducer) is also input to each of the mixers 39 at a second input terminal 43 from a conventional source, not shown.

Figure 4:
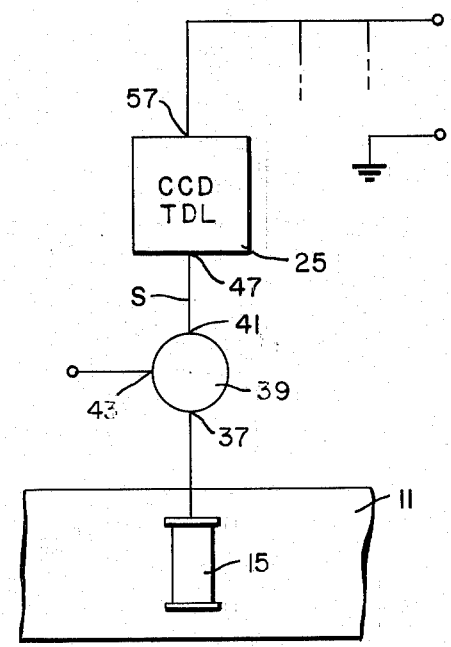
FIG. 4 is a block diagram of a surface acoustic wave/charge coupled device tapped delay line in accordance with another embodiment of the present invention.

Alternately, where the system is synchronized with the incoming signal introduced at terminal 19, the two component signals, I and Q, and the circuitry producing such signals, will not be required. Thus, as shown in FIG. 4, the SAW TDL output signal from each tapping output transducer 15 is directly coupled to a first input port 37 of a mixer 39, and the difference signal, S, is provided at the mixer output terminal 41 to an associated CCD TDL 25. The output signals from each of the other CCD TDL's each coupled to a different tapping output transducer (not shown) of the SAW TDL 11 are summed in a conventional manner to provide a desired system output signal.

Figure 5:
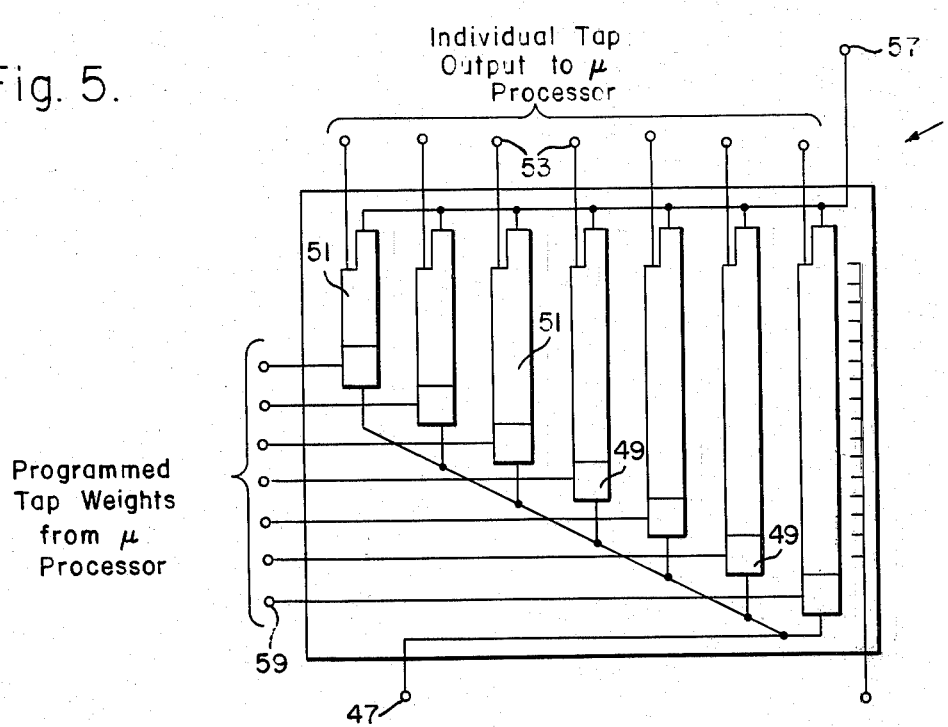
FIG. 5 is a schematic diagram of a conceptual model illustrating a type of charge coupled device analog shift register, in accordance with the invention.

Referring now to FIG. 5, there is shown a conceptual model 25' of a CCD TDL containing individual parallel registers with delays increasing in increments of one clock period (i.e., one delay stage). An actual CCD layout could, of course, comprise a single multiple-tapped register. The I or Q components signal, for example, is coupled to an input terminal 47 where it is simultaneously presented to the respective inputs of the N variable-gain MOSFET amplifiers 49 associated with each of the N CCD registers 51 in the CCD chip. The outputs of the N registers are brought out individually at terminal 53 (for control of the tap weights by means of a microprocessor, for example) and these signals are summed within the chip along buss 55 and provided at an output terminal 57 to form part of the transversal filter output.

As noted previously, the output signals from the N CCD registers in FIG. 5 are individually available at terminals 53. These signals are used in a feedback loop, and where programming of the tap weights is desired, through a microprocessor, for example, to individual amplifier gain control input terminals 59. Of course, the gain of each of the amplifiers 49 could be fixed, if desired, eliminating the need for the feedback circuitry. It can thus be seen that when the CCD TDL chips are to be operated at baseband, the SAW tap outputs must be split into I and Q component channels, which then necessitates the use of a separate CCD TDL for each I and Q channel for each SAW TDL tap, and appropriate logic must be included in the aforementioned feedback loop to accomodate the I and Q data.

It can be seen, when considering the impulse response of the hybrid combination according to the invention, that the configuration of FIG. 5 is equivalent to a uniform tapped delay line of $N \times M$ taps. The first SAW tap yields an impulse at $t=0$, which produces weighted CCD outputs at $t = t_c, 2t_c, 3t_c, \ldots, Nt_c$. Meanwhile, the second SAW tap produces an impulse at $t = Nt_c$, which results in outputs from a second CCD at $t = (N+1)t_c, \ldots, 2Nt_c$. Thus, for M-SAW taps the last impulse out of the Mth CCD is at $MNt_c$, which is exactly what is anticipated for a uniform TDL.

Figure 6:
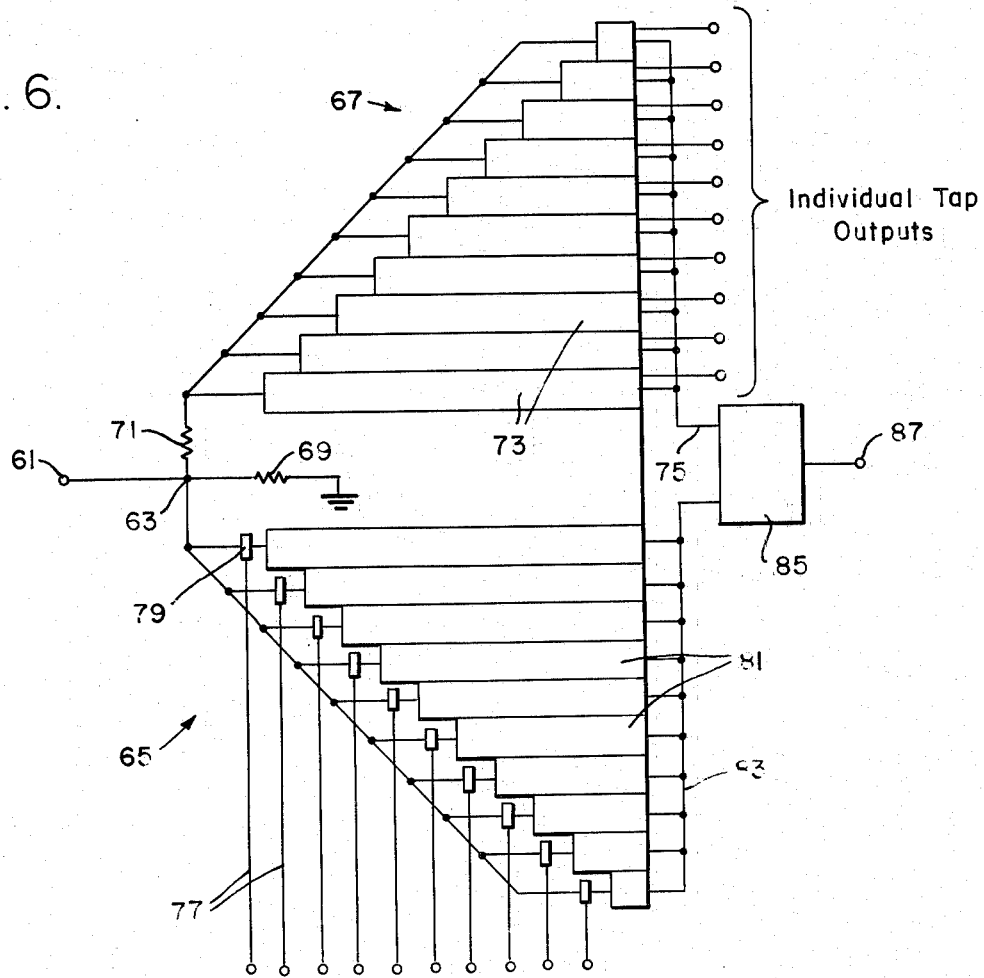
FIG. 6 is a detailed (functional) view of a charge coupled device tapped delay line providing bipolar tap weights.

It is important to note that since the output signal from each CCD register has only one polarity, provisions must be made in the CCD circuit design to accomodate both positive and negative tap weights. A configuration such as that shown in FIG. 6 (for 10 delay channels) is suitable for providing the required bipolar outputs. The incoming signal, s(t), is coupled to terminal 61 and is divided at junction 63 and routed into two different CCD TDL's, 65 and 67 by means of a voltage divider network comprising similar resistors 69 and 71, one leading to ground and the other to the CCD TDL 67 which has ten CCD registers 73 with fixed unity tap weights. Thus, a half-amplitude input signal will enter the latter TDL giving outputs $(\frac{1}{2})s(t_c)\delta(t-kt_c)$ at output buss 75. A unity amplitude replica of the input signal also enters the TDL 65 which is programmable (one-polarity) tap weights, $\delta_k$, provided by control signals on leads 77 leading to MOSFET amplifiers 79 and associated CCD registers 81 yielding outputs, $\alpha_k s(t_c)\delta(t-kt_c)$ at output bus 83. The output signals present on the output busses are coupled to a conventional differential amplifier 85 to provide a final output signal at output terminal 87 given by the expression:

$$h(t) = \sum_{k=1}^{N} W_k s(t_c)\delta(t - kt_c)$$

where the effective tap weights, $W_k$ are given by $$W_k = (\tfrac{1}{2}) - \alpha_k$$

and $\alpha_k$ are the actual tap weights which range from zero to one.

From the foregoing, it should be evident that the SAW/CCD transversal filter herein described offers several important advantages over an all-SAW or an all-CCD configuration. First, the required number of SAW taps is reduced by the factor N, and correspondingly the tap to tap separation is increased by N. Reducing the number of SAW taps greatly eases SAW TDL design restrictions. Also, space becomes available to include MSC or RAC structures between taps, or to drive the taps in parallel and thereby alleviate stopband problems of the type, for example, described in an article entitled, "Acoustic Surface Wave Burst Correlator", IEEE Proceedings on Microwave Theory and Techniques by H. M. Gerard et al, IEEE Cat. No. 74 CHO 838-3MTT (June 1974) pp. 240-242; and an article by MacLennon et al, entitled, "Novel Tapping Technique for Charge Coupled Devices", in Electronics Letters, 9, pp. 610-611. In addition, by being tapped only M times the SAW signal can be tapped more strongly by a factor $10 \log_{10} N$, (dB) which improves the S/N ratio. Increasing the SAW tap separation also eases problems of interfacing with control circuits and improves tap to tap feedthru isolation.

The utilization of relatively short, N-tap CCD's also has significant advantages. First, monolithic incorporation of TDL tap-weight circuits is straightforward, resulting in smaller size and higher speed. Second, when the total number of transfers is relatively small, CCD operation at very high speeds becomes practical. Also, delay and dispersion increase slowly with $\epsilon$, the charge transfer loss per stage, when the number of taps, N, is on the order of 10-20. In addition, possible tap to tap feedthru problems are easily prevented by appropriately shielding the semiconductor circuitry.

It should be further noted that in most common utilizations, SAW technology is preferred for broadband applications, while CCD's are employed for low speed and long delay. In contradistinction thereto, the SAW/CCD hybrid TDL according to the present invention combine these technologies in a manner which over comes the bias in the art. That is, the SAW TDL provides the long delay time characteristic that is required for high filter resolution, while the CCD provides the broad bandwidth analog processing. The justification for this rests on the fact that SAW propagation attenuation at high frequencies is generally quite low compared with the equivalent effect of charge transfer loss in CCD's. On the other hand, the ease with which semiconductor control circuitry is implemented in a high-density TDL format supports the use of the CCD at high clock speeds to provide the vernier tap delays and programmability.

What is claimed is:

1. A hybrid transversal filter, comprising:
a surface acoustic wave tapped delay line having an input signal terminal and producing at separate output terminals a plurality of respective SAW output signals in response to an input signal, each of said SAW output signals having a different and relatively long time delay;
charge coupled device means including an array of charge coupled device tapped delay lines each having an input coupled to a different one of said surface acoustic wave tapped delay line output terminals and responsive to said SAW output signals, each of said charge coupled device tapped delay lines generating at respective outputs a plurality of relatively short time delay signals; and
component signal coupling circuit means including a different coupling circuit responsive to each of said SAW output signals for providing at each of said coupling circuits a pair of component signals associated with a respective SAW output signal, and wherein each of said component signals is coupled by different ones of said charge coupled device tapped delay lines, for producing collectively a relatively broad bandwidth analog processed transversal filter output signal.

2. The hybrid transversal filter according to claim 1, wherein one of each pair of said component signals represents a first channel and another of each pair of said component signals represents a second channel, and wherein each of said charge coupled device tapped delay lines responsive to said first channel component signals are coupled together providing a first channel composite signal, and each of said charge coupled devide tapped delay lines responsive to said second channel component signals are coupled together providing a second channel composite signal, said composite signals constituting said transversal filter output signal.

3. The hybrid transversal filter according to claim 1, wherein said surface acoustic wave tapped delay line includes a plurality of tapping output transducers each producing a different one of said SAW output signals, wherein said coupling circuit means includes a 90° power splitter circuit having an input port coupled to a different one of said tapping output transducers, said power splitter circuit also having a pair of 90° phase selected power splitter output ports, and wherein said coupling circuit means also includes a different mixer circuit having a first mixer input port coupled to each of said power splitter output ports and a CW wave input port, said mixer circuits including a mixer output port providing one of said pair of component signals.

4. The hybrid transversal filter according to claim 1, also comprising synchronized signal coupling circuit means including a different mixer circuit responsive to each of said SAW output signals, said mixer circuit including a CW wave input port and a mixer output port coupled to an associated one of said charge coupled device tapped delay lines.

5. The hybrid transversal filter according to claim 1, wherein each of said charge coupled device tapped delay lines includes a plurality of parallel charge coupled device registers.

6. The hybrid transversal filter according to claim 5, wherein each of said charge coupled device tapped delay also includes a different amplifier coupled in series with each of said registers, each of said amplifiers having a predetermined gain value.

7. The hybrid transversal filter according to claim 5, wherein each of said charge coupled device tapped delay lines also includes a different adjustable-gain amplifier coupled in series with each of said registers.

8. The hybrid transversal filter according to claim 5, wherein each of said registers includes a separate feedback-gain control output terminal and a common output terminal coupled to common output terminals of said registers in an individual one of said charge coupled device tapped delay lines.

9. The hybrid transversal filter according to claim 1, wherein each of said charge coupled device tapped delay lines includes a first and second set of parallel charge coupled device registers, each set producing a signal component of a bipolar output signal.

10. The hybrid transversal filter according to claim 9, wherein said charge coupled device tapped delay lines include input signal splitting circuitry means for providing a half-amplitude input signal to said first set of registers and a unity amplitude replica to said second set of registers, said first set of registers having fixed tap weighted characteristic and said second set of registers having a programmable tap weighted characteristic, the output terminals from each of said registers in said first set being coupled together at a second output buss, said charge coupled device tapped delay lines also including a differential amplifier, said output busses each being coupled to a different input terminal of said differential amplifier.

* * * * *